United States Patent
Rao et al.

(10) Patent No.: US 8,138,858 B1
(45) Date of Patent: Mar. 20, 2012

(54) ARCHITECTURES USING MULTIPLE DUAL-MODE SURFACE ACOUSTIC WAVE DEVICES

(75) Inventors: Jayanti Jaganatha Rao, Jamestown, NC (US); Aleh Loseu, Greensboro, NC (US); Kevin J. Gamble, Huntsville, AL (US)

(73) Assignee: RF Micro Devices, Inc., Greensboro, NC (US)

( * ) Notice: Subject to any disclaimer, the term of this patent is extended or adjusted under 35 U.S.C. 154(b) by 199 days.

(21) Appl. No.: 12/260,703

(22) Filed: Oct. 29, 2008

Related U.S. Application Data

(60) Provisional application No. 60/983,471, filed on Oct. 29, 2007.

(51) Int. Cl.
*H03H 9/64* (2006.01)

(52) U.S. Cl. ................ 333/195; 310/313 D; 333/193

(58) Field of Classification Search .......... 333/193–196; 310/313 B
See application file for complete search history.

(56) References Cited

U.S. PATENT DOCUMENTS

| | | | |
|---|---|---|---|
| 5,392,013 A * | 2/1995 | Yamamoto et al. | 333/195 |
| 5,699,028 A * | 12/1997 | Hiraishi et al. | 333/195 |
| 6,424,239 B1 * | 7/2002 | Ehara et al. | 333/193 |
| 6,472,959 B1 * | 10/2002 | Beaudin et al. | 333/193 |
| 6,483,402 B2 * | 11/2002 | Endoh et al. | 333/193 |
| 6,791,437 B2 * | 9/2004 | Hagn et al. | 333/195 |
| 6,936,952 B2 | 8/2005 | Takamine | |
| 6,965,282 B2 | 11/2005 | Kawachi et al. | |
| 7,019,435 B2 * | 3/2006 | Nakaya et al. | 310/313 D |
| 7,078,989 B2 | 7/2006 | Inoue et al. | |
| 2004/0075511 A1 * | 4/2004 | Inoue et al. | 333/133 |
| 2004/0196119 A1 * | 10/2004 | Shibahara et al. | 333/193 |
| 2007/0103254 A1 * | 5/2007 | Haruta et al. | 333/133 |
| 2007/0279156 A1 * | 12/2007 | Pitschi et al. | 333/193 |

FOREIGN PATENT DOCUMENTS

| | | | |
|---|---|---|---|
| JP | 07-074588 | * | 3/1995 |
| JP | 08-116232 | * | 5/1996 |
| JP | 2000-201048 | * | 7/2000 |
| JP | 2000-349589 | * | 12/2000 |
| JP | 2004-320812 | * | 11/2004 |
| WO | WO 2004/109911 A2 | * | 12/2004 |

OTHER PUBLICATIONS

"BONDW1 to BONDW50 (Philips/TU Delft Bondwires Model)," Distributed Components, Aug. 2005, pp. 4-15 to 4-28, Agilent Technologies.

Dufilie, Pierre et al., "Modeling of Feedthrough and Ground Loops in SAW Filters," IEEE Ultrasonics Symposium, 1993, pp. 223-226, IEEE.

(Continued)

*Primary Examiner* — Barbara Summons
(74) *Attorney, Agent, or Firm* — Withrow & Terranova, P.L.L.C.

(57) ABSTRACT

The present invention relates to dual-mode SAW devices (DMSDs), which may allow for clean layouts of SAW device elements and provide low impedance with reduced insertion loss, and may increase broadband rejection by improving parasitic characteristics. In one embodiment of the present invention, a parallel set of DMSDs is cascaded with another parallel set of DMSDs. Internal connections between the four DMSDs may be electrically floating, which may further improve parasitic characteristics. With electrically floating internal connections, the parallel set of DMSDs may share a common grating structure, thereby reducing the size and complexity of a DMSD, which may further improve parasitic characteristics. The DMSDs may be used in radio frequency (RF) applications, such as SAW filters.

14 Claims, 12 Drawing Sheets

OTHER PUBLICATIONS

Kando, Hajime et al, "RF Filter Using Boundary Acoustic Wave," IEEE Ultrasonics Symposium, 2006, pp. 188-191, IEEE.

Kiwitt, Jurgen et al., "Novel Approaches to the Electromagnetic Design of CSSP RF Filters with Improved Selectivity," IEEE International Ultrasonics, Ferroelectrics, and Frequency Control Joint 50th Anniversary Conference, 2004, IEEE.

Lin, Shin-Hung et al., "Full Wave Simulation of SAW Filter Package and SAW Pattern Inside Package," IEEE Ultrasonics Symposium, 2003, pp. 2089-2092, IEEE.

Mineyoshi, S. et al., "Analysis and Optimal SAW Ladder Filter Design Including Bonding Wire and Package Impedance," IEEE Ultrasonics Symposium, 1997, pp. 175-178, IEEE.

Perois, Xavier et al., "An Accurate Design and Modeling Tool for the Design of RF SAW Filters," IEEE Symposium, 2001, pp. 75-80, IEEE.

Yatsuda, Hiromi, "Modeling of Parasitic Effects for Flip-Chip SAW Filters," IEEE Ultrasonics Symposium, 1997, pp. 143-146, IEEE.

* cited by examiner

US 8,138,858 B1

ARCHITECTURES USING MULTIPLE DUAL-MODE SURFACE ACOUSTIC WAVE DEVICES

This application claims the benefit of provisional patent application Ser. No. 60/983,471, filed Oct. 29, 2007, the disclosure of which is hereby incorporated herein by reference in its entirety.

FIELD OF THE INVENTION

Embodiments of the present invention relate to surface acoustic wave (SAW) devices, particularly SAW filters, which may be used in radio frequency (RF) communications systems.

BACKGROUND OF THE INVENTION

As technology progresses, wireless devices tend to integrate more features and become increasingly ubiquitous. For example, wireless devices may include features associated with personal digital assistants (PDAs), cellular telephones, wireless internet access devices, global positioning system (GPS) receivers, and the like. Therefore, multiple radio frequency (RF) signals spanning a wide frequency range are common in many areas and may interfere with one another. Wireless devices may support one or more wireless communications protocols, such as third (3G), fourth (4G), or later generation cellular telephone protocols, GPS protocols, wireless fidelity (Wi-Fi) protocols, Bluetooth®, and the like. Some of these protocols may have tight channel spacings that require narrow channel bandwidths. Therefore, such wireless devices using narrow channel bandwidths may need RF filters that have narrow passbands to accept desirable signals and have maximum broadband rejection to remove interfering signals.

Surface acoustic wave (SAW) devices are electro-mechanical devices that utilize surface acoustic waves, which travel along the surface of a piezoelectric material having some elasticity. Piezoelectric material has a relationship between an electrical signal and mechanical movement within the material. An applied electrical signal may be used to cause the mechanical movement, which may include surface acoustic waves, or the mechanical movement may be used to provide an electrical signal. Therefore, the piezoelectric material may be used as a transducer for transduction between an electrical signal and mechanical movement. An inter-digital transducer (IDT) is a special type of transducer used to convert an electrical signal into surface acoustic waves or to convert surface acoustic waves into an electrical signal.

A SAW filter may use two IDTs. A first IDT may be acoustically coupled to a second IDT. The first IDT receives an input signal and the second IDT provides an output signal based on the surface acoustic waves that are coupled between the IDTs. Such a SAW filter may provide a narrow passband. Rejection of signals outside the passband depend upon impedances between the IDTs and impedances between each IDT and ground. These impedances may be affected by construction and layout of the SAW filter and parasitic characteristics of the SAW filter. Typically, SAW devices that are used in RF communications equipment may require low impedances needed by such equipment. Additionally, to preserve signal integrity, SAW devices may need to have minimal insertion loss. Thus, there is a need for a SAW device having low impedance, minimal insertion loss, a narrow passband, and maximum broadband rejection.

SUMMARY OF THE EMBODIMENTS

The present invention relates to 2-IDT dual-mode SAW devices (DMSDs), which may allow for clean layouts of SAW device elements and provide low impedance with reduced insertion loss, and may increase broadband rejection by improving parasitic characteristics. Each DMSD may have interdigitated fingers that are about parallel to one another and may be about parallel to grating fingers in adjacent grating structures. In one embodiment of the present invention, a parallel set of DMSDs is cascaded with another parallel set of DMSDs. Internal connections between the four DMSDs may be electrically floating, which may further improve parasitic characteristics. With electrically floating internal connections, the parallel set of DMSDs may share a common grating structure, thereby reducing the size and complexity of a dual-mode SAW device, which may further improve parasitic characteristics. The dual-mode SAW devices may be used in RF filtering applications.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 7:
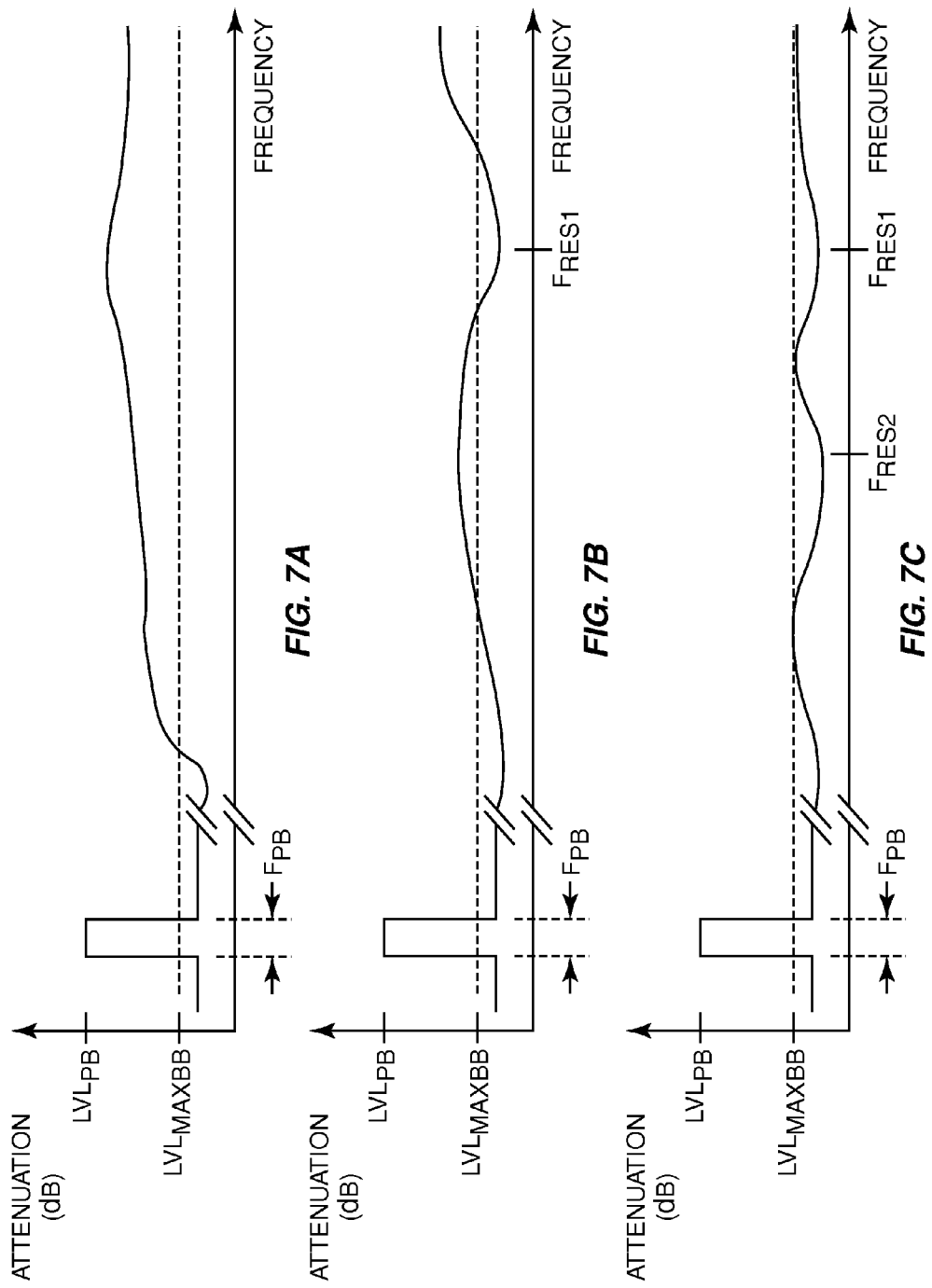

FIGS. 7A, 7B, and 7C compare frequency responses of the cascaded DMSD device, the floating-connection cascaded DMSD device, and the floating-connection four DMSD device, respectively.

Figure 8:
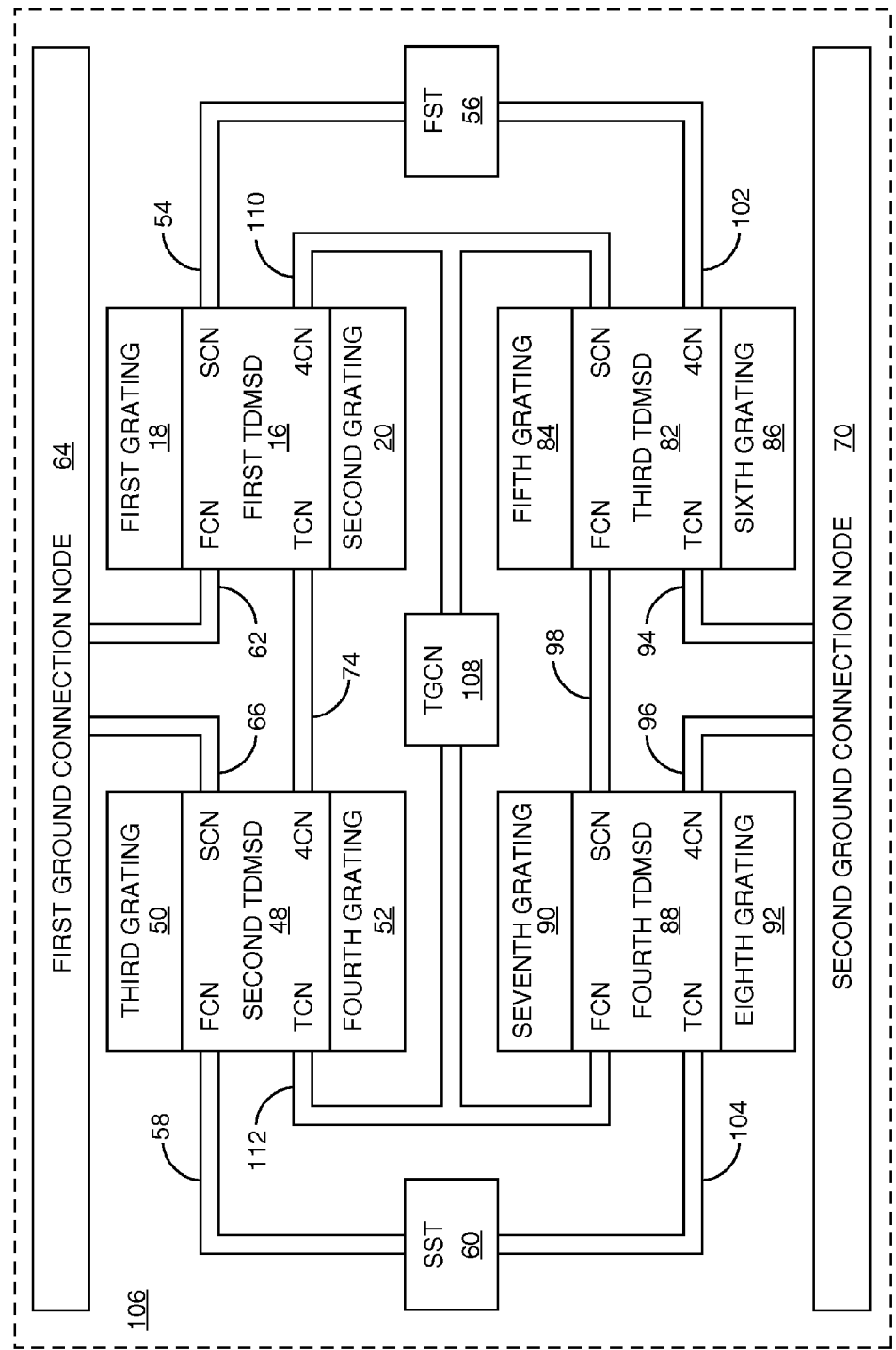

FIG. 8 shows a four DMSD device, according to a second embodiment of the present invention.

Figure 9:
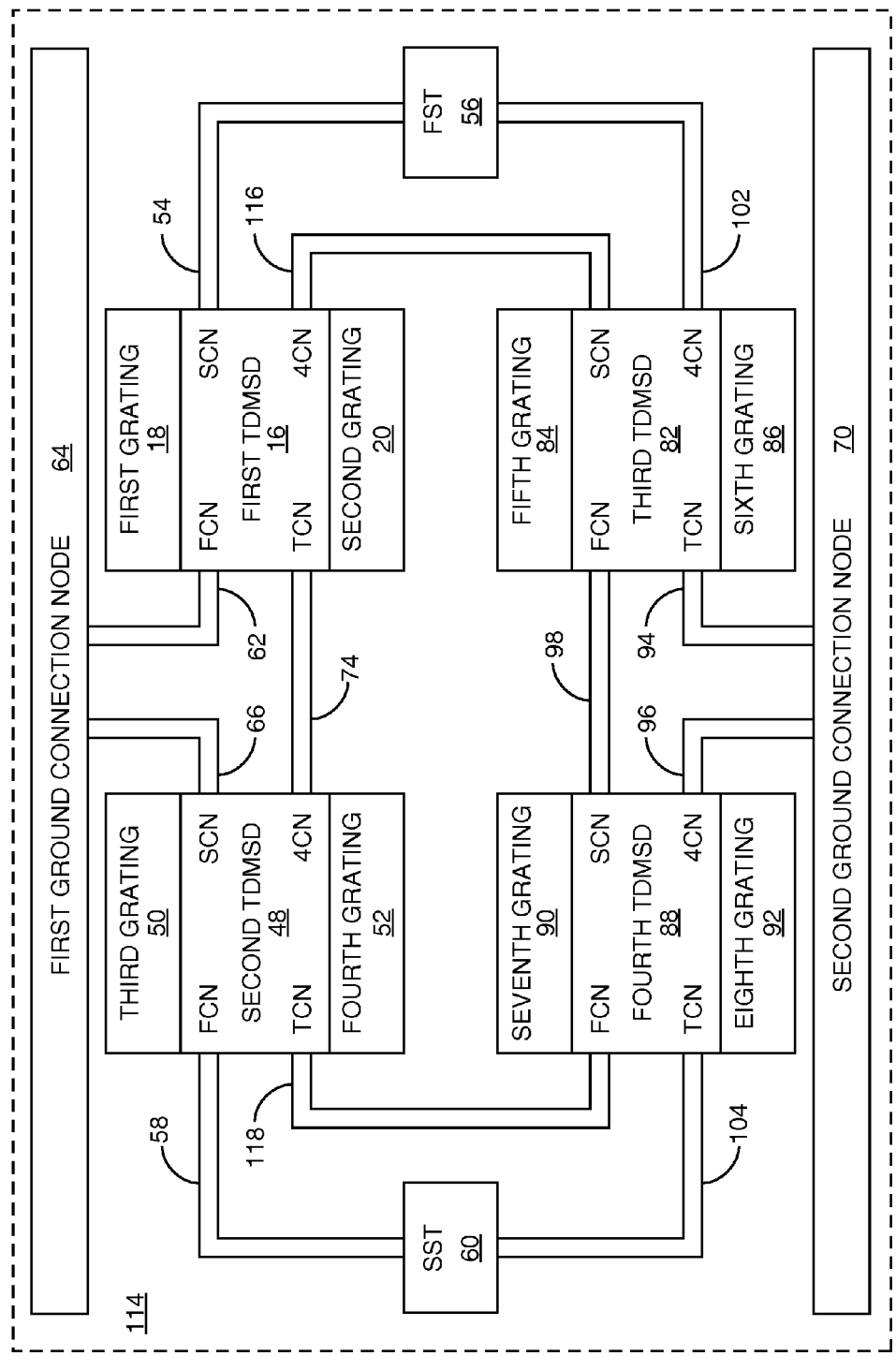

FIG. 9 shows a balanced floating-connection four DMSD device, according to a third embodiment of the present invention.

Figure 10:
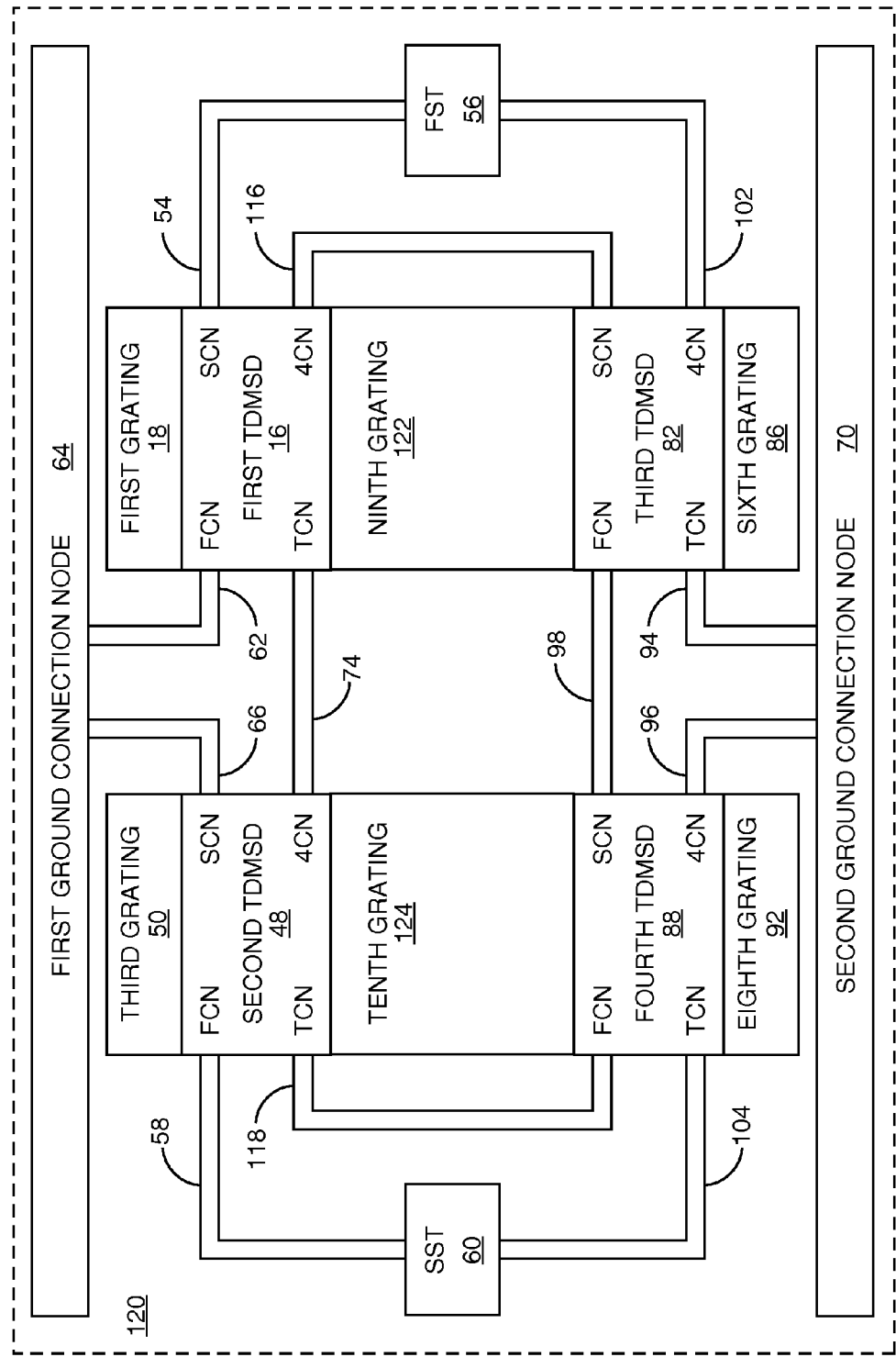

FIG. 10 shows a shared-grating balanced floating-connection four DMSD device, according to a fourth embodiment of the present invention.

Figure 11:
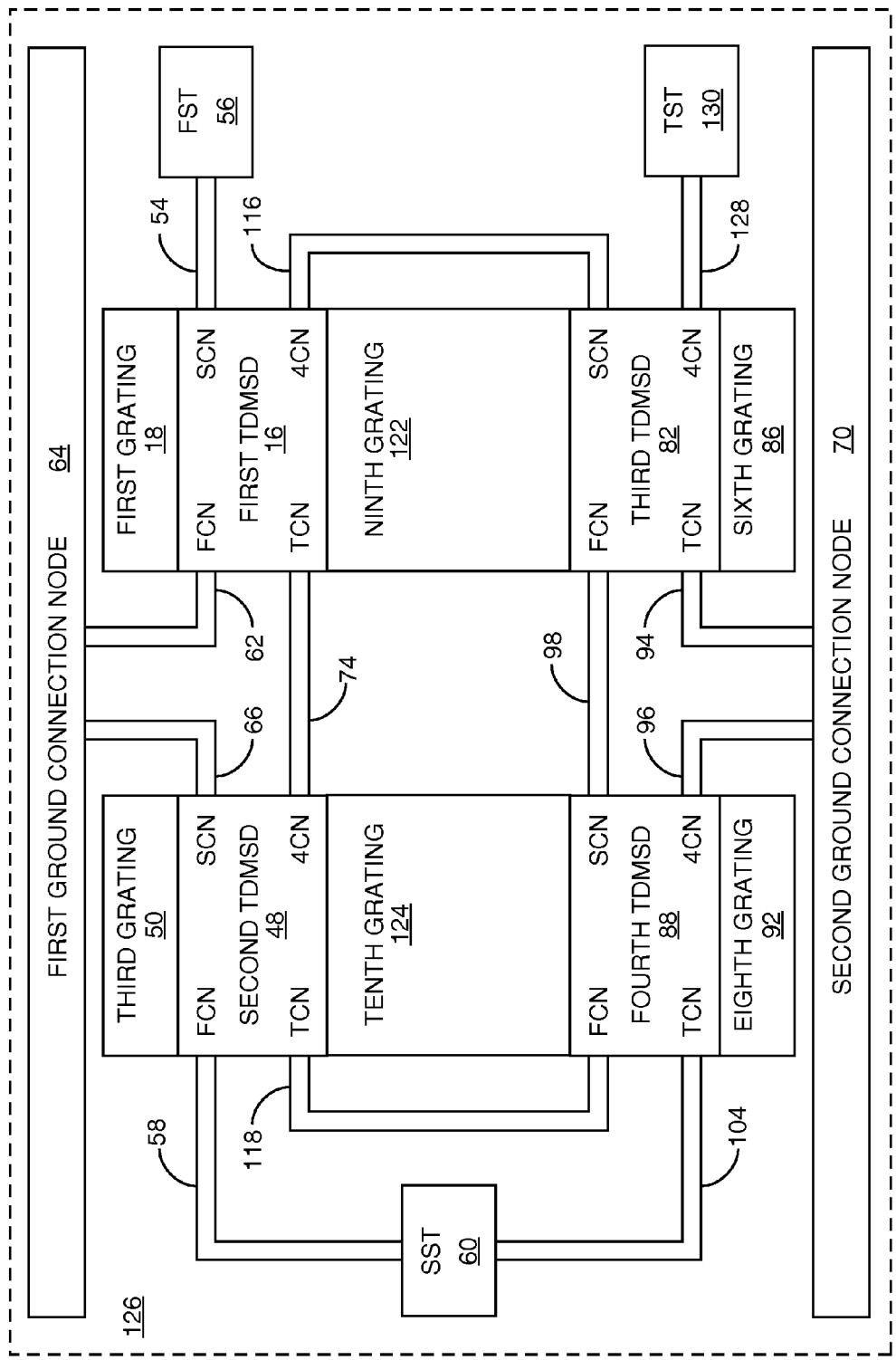

FIG. 11 shows a single-ended interface and balanced interface four DMSD device, according to a fifth embodiment of the present invention.

Figure 12:
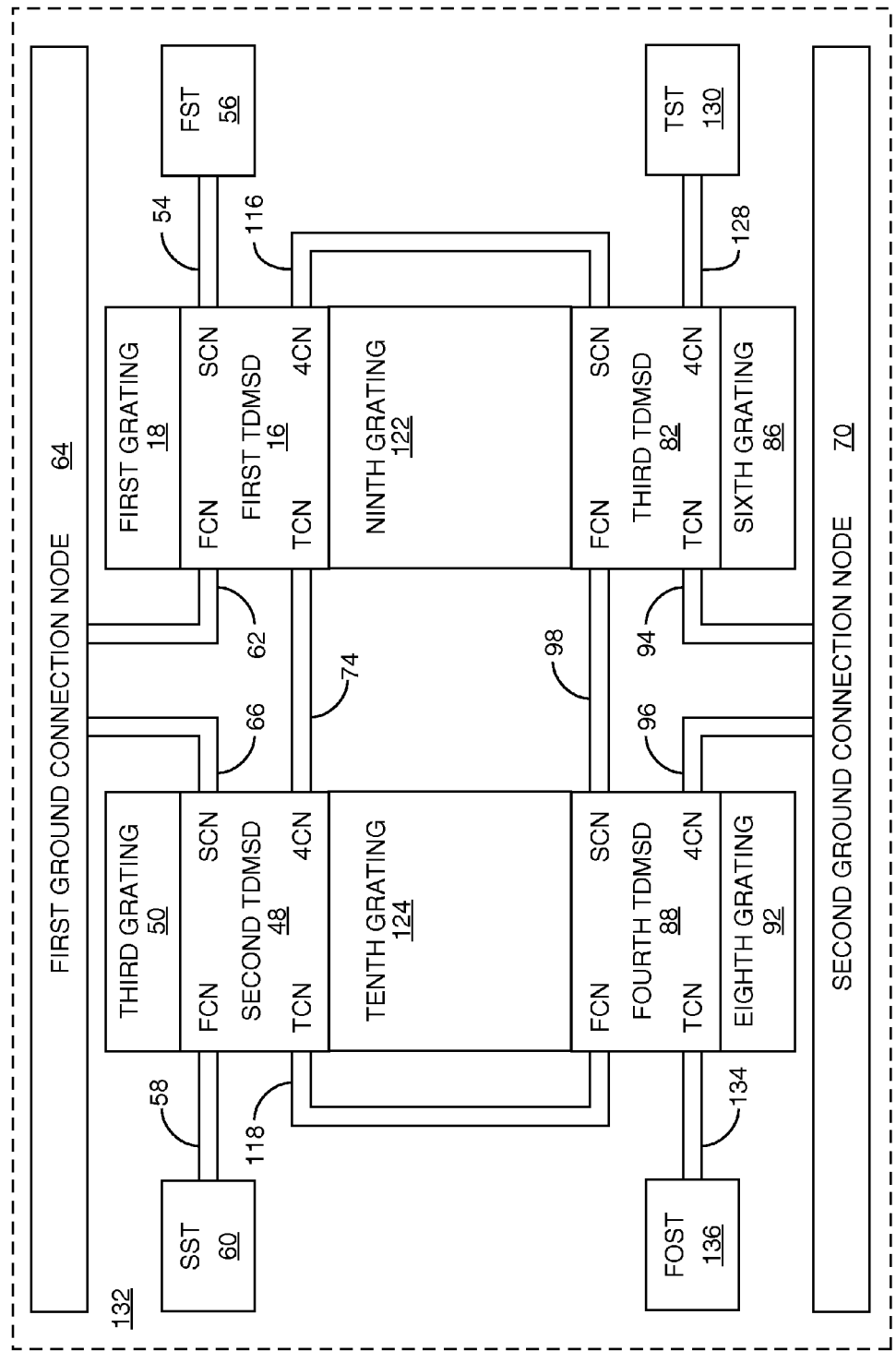

FIG. 12 shows a dual balanced interface four DMSD device, according to a sixth embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to dual-mode SAW devices (DMSDs), which may allow for clean layouts of SAW device elements, provide low impedance with reduced insertion loss, and may increase broadband rejection by improving parasitic characteristics. Each DMSD may have interdigitated fingers that are about parallel to one another and may be about parallel to grating fingers in adjacent grating structures. In one embodiment of the present invention, a parallel set of DMSDs is cascaded with another parallel set of DMSDs. Internal connections between the four DMSDs may be electrically floating, which may further improve parasitic characteristics. With electrically floating internal connections, the parallel set of DMSDs may share a common grating structure, thereby reducing the size and complexity of a DMSD, which may further improve parasitic characteristics. The DMSDs may be used in RF filtering applications.

Figure 1:
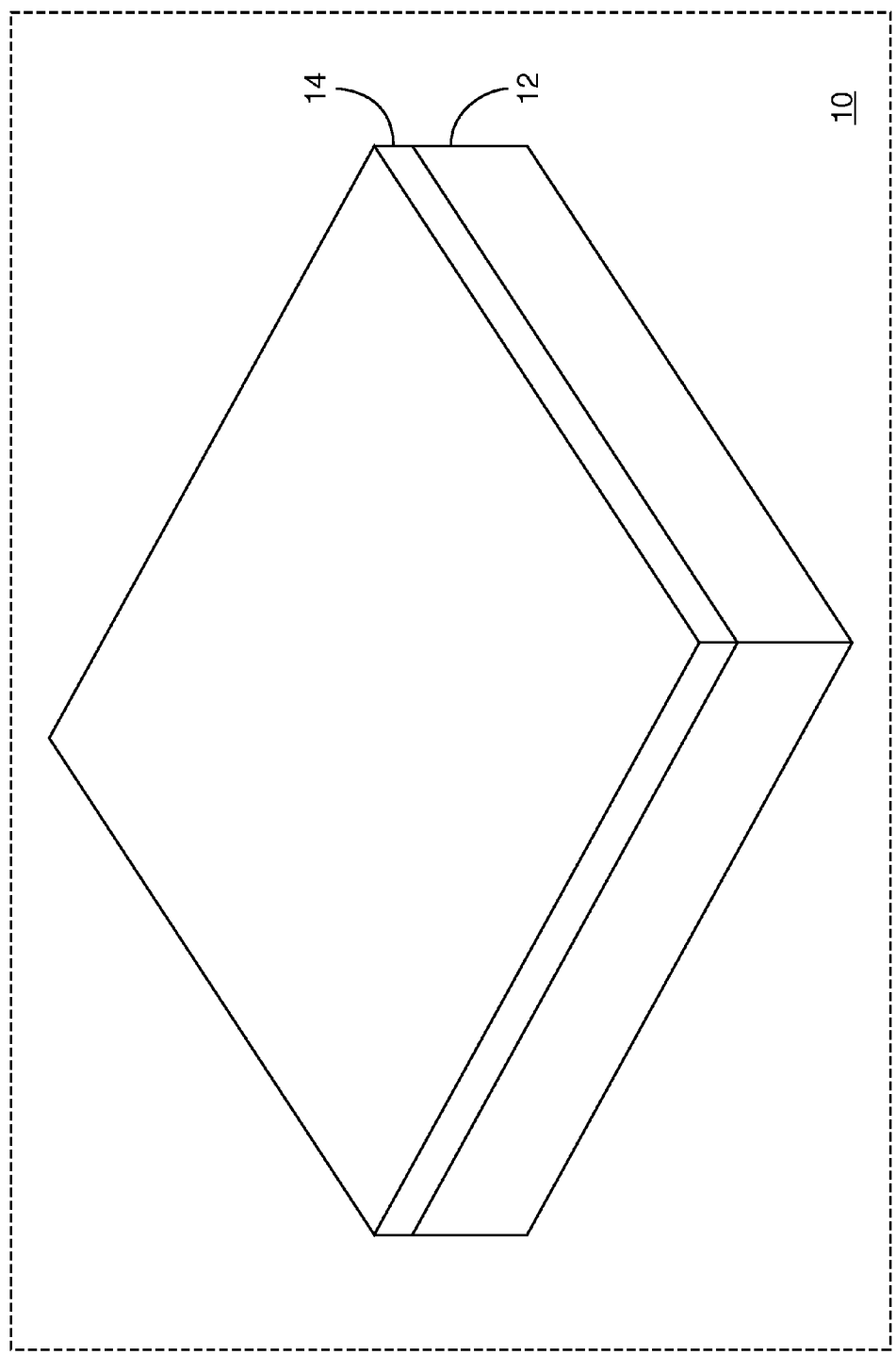
FIG. 1 shows an isometric view of a piezoelectric wafer that may be suitable for fabricating surface acoustic wave (SAW) devices, according to the prior art.

FIG. 1 shows an isometric view of a piezoelectric wafer 10 that may be suitable for fabricating SAW devices, according to the prior art. A piezoelectric substrate 12 provides piezoelectric material upon which SAW devices are formed. A conductive layer 14 is over the piezoelectric substrate 12 and is patterned to provide electrical connections and conductive elements of the SAW devices. The piezoelectric substrate 12 may include Quartz, Lithium Tantalate, Lithium Niobate, or the like. The conductive layer 14 may include a metallization layer, or the like.

Figure 2:
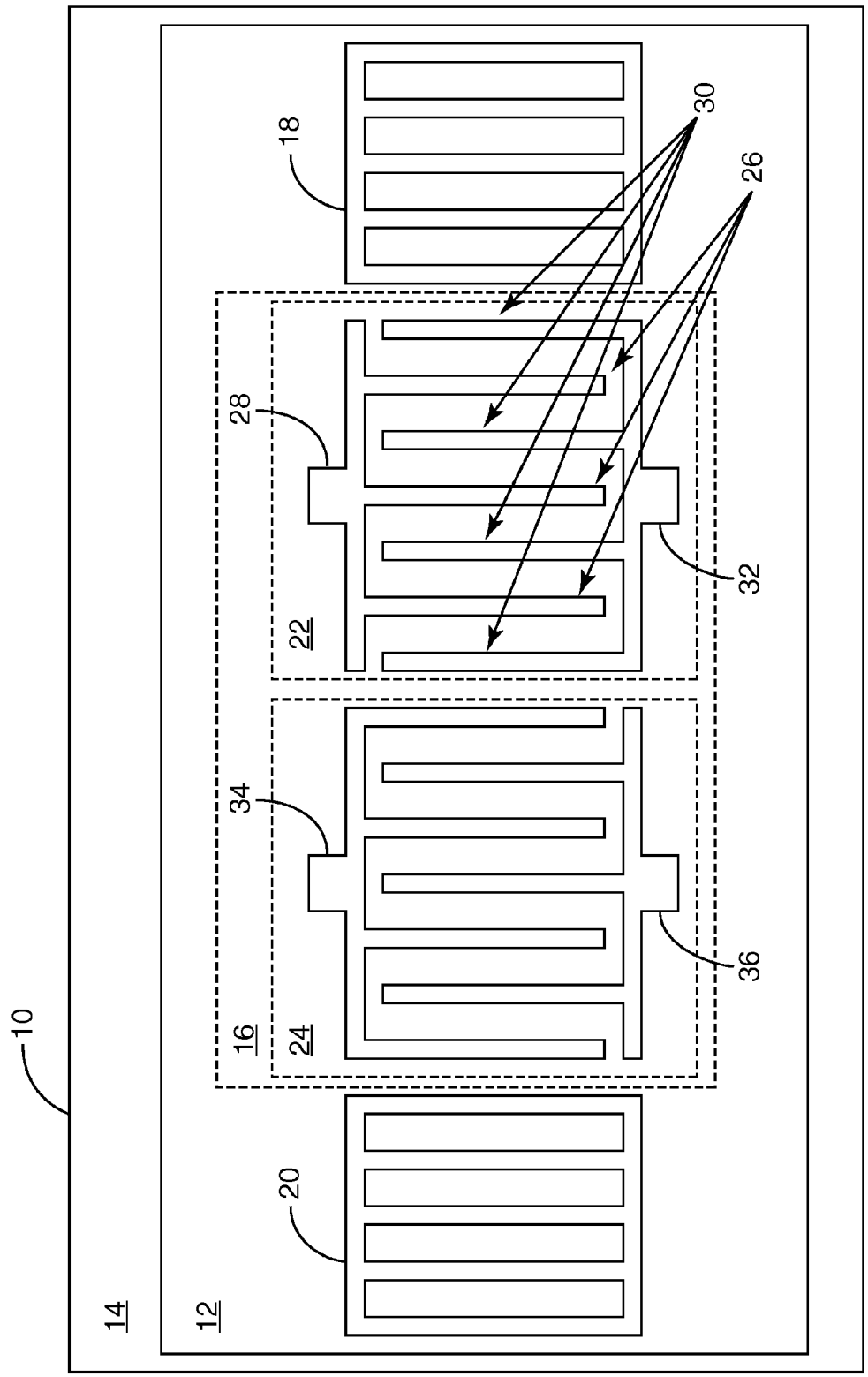
FIG. 2 shows a top-view of a conductive layer over a piezoelectric substrate, such that parts of the conductive layer are removed to form a first dual-mode SAW device (DMSD), according to the prior art.

FIG. 2 shows a top-view of the conductive layer 14 over the piezoelectric substrate 12, such that parts of the conductive layer 14 are removed to form a first DMSD, according to the prior art. The first DMSD includes a first transconductive portion of the DMSD (TDMSD) 16, a first grating structure 18, and a second grating structure 20. The first TDMSD 16 includes a first IDT 22 adjacent to the first grating structure 18 and adjacent to a second IDT 24, which is adjacent to the second grating structure 20. The first IDT 22 has first fingers 26 electrically coupled to a first connection node (FCN) 28 and second fingers 30 electrically coupled to a second connection node (SCN) 32. The first fingers 26 are interlaced with, electrically isolated from, and acoustically coupled to the second fingers 30 to form interdigitated fingers.

The first and second fingers 26, 30 over the piezoelectric substrate 12 form an IDT, such that an electrical signal applied between the FCN 28 and the SCN 32 may generate surface acoustic waves in the piezoelectric substrate 12. Likewise, surface acoustic waves in the piezoelectric substrate 12 may generate an electrical signal between the FCN 28 and the SCN 32. Similar to the first IDT 22, the second IDT 24 has interdigitated fingers electrically coupled to a third connection node (TCN) 34 and a fourth connection node (4CN) 36. The first and second grating structures 18, 20 may include multiple grating fingers that are about parallel to the interdigitated fingers of the first and second IDTs 22, 24.

Figure 3:
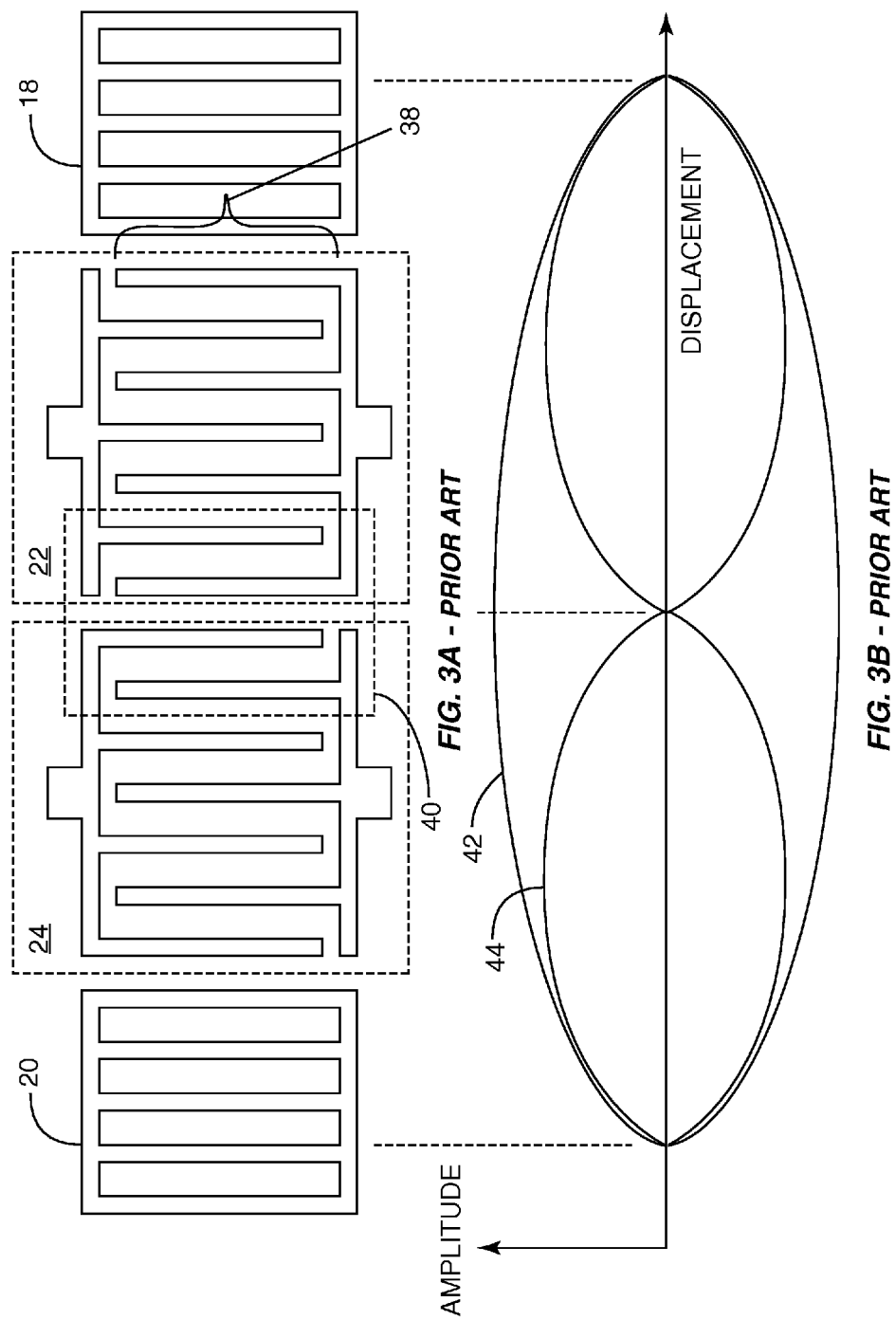
FIG. 3A shows details of construction of the first DMSD in FIG. 2, according to the prior art.
FIG. 3B is a graph showing a first mode and a second mode of the first DMSD illustrated in FIG. 3A according to the prior art.

FIG. 3A shows dual-mode SAW coupling between the first IDT 22 and the second IDT 24 illustrated in FIG. 2, according to the prior art. The first and second fingers 26, 30 have a finger length 38 that determines a width of an acoustic aperture of the first IDT 22. An input impedance of the first IDT 22 at frequencies in a passband of the first DMSD is inversely related to the width of the acoustic aperture. To achieve a low input impedance, as required in some RF communications systems, a wide acoustic aperture is required, which requires long finger lengths 38. Increasing finger lengths 38 increases insertion loss; therefore, architectures that reduce finger lengths 38 while providing the required acoustic aperture may be desirable. The first DMSD relies on dual-mode SAW coupling between the first and second IDTs 22, 24. A chirping region 40 overlaps the first and second IDTs 22, 24 and provides the appropriate SAW coupling. In the chirping region 40, the widths of individual fingers, the spacing between fingers, or both may vary to provide SAW coupling that varies with frequency, thereby providing a desired frequency response of the first DMSD. The first and second grating structures 18, 20 substantially contain SAW propagation within the first DMSD.

FIG. 3B is a graph showing a first mode and a second mode of the first DMSD illustrated in FIG. 3A. The first mode is a symmetric mode having a symmetric mode response 42 that has an amplitude peak at the center of the chirping region 40. The second mode is an anti-symmetric mode having an anti-symmetric mode response 44 that has an amplitude valley at the center of the chirping region 40.

Figure 4:
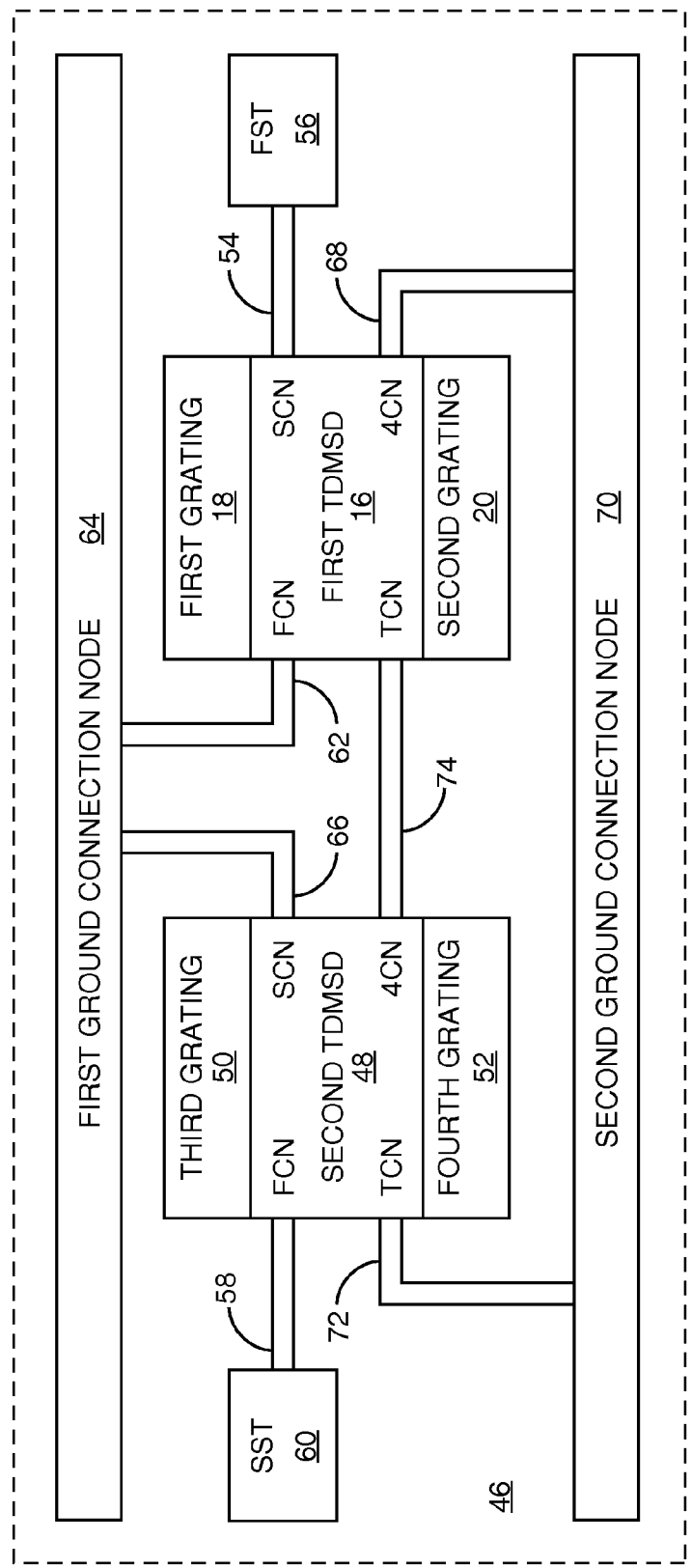
FIG. 4 shows a cascaded DMSD device, according to the prior art.

FIG. 4 shows a cascaded DMSD device 46, according to the prior art. The first DMSD is cascaded with a second DMSD, which is similar to the first DMSD and includes a second TDMSD 48, a third grating structure 50, and a fourth grating structure 52. The second TDMSD 48 includes a third IDT (not shown) and a fourth IDT (not shown). The third IDT is adjacent to the third grating structure 50 and adjacent the fourth IDT, which is adjacent to the fourth grating structure 52. The third and fourth grating structures 50, 52 may include multiple grating fingers that are about parallel to the interdigitated fingers of the third and fourth IDTs. A first connection 54 is provided by the conductive layer 14 and couples the SCN of the first TDMSD 16 to a first SAW terminal (FST) 56. A second connection 58 is provided by the conductive layer 14 and couples the FCN of the second TDMSD 48 to a second SAW terminal (SST) 60. A third connection 62 is provided by the conductive layer 14 and couples the FCN of the first TDMSD 16 to a first ground connection node (GCN) 64.

A fourth connection 66 is provided by the conductive layer 14 and couples the SCN of the second TDMSD 48 to the first GCN 64. A fifth connection 68 is provided by the conductive layer 14 and couples the 4CN of the first TDMSD 16 to a second GCN 70. A sixth connection 72 is provided by the conductive layer 14 and couples the TCN of the second TDMSD 48 to the second GCN 70. A seventh connection 74 is provided by the conductive layer 14 and couples the TCN of the first TDMSD 16 to the 4CN of the second TDMSD 48. Cascading the first DMSD with the second DMSD may provide good isolation between the first and second SAW terminals 56, 60, and may provide good coupling to ground, which may provide good broadband rejection.

Figure 5:
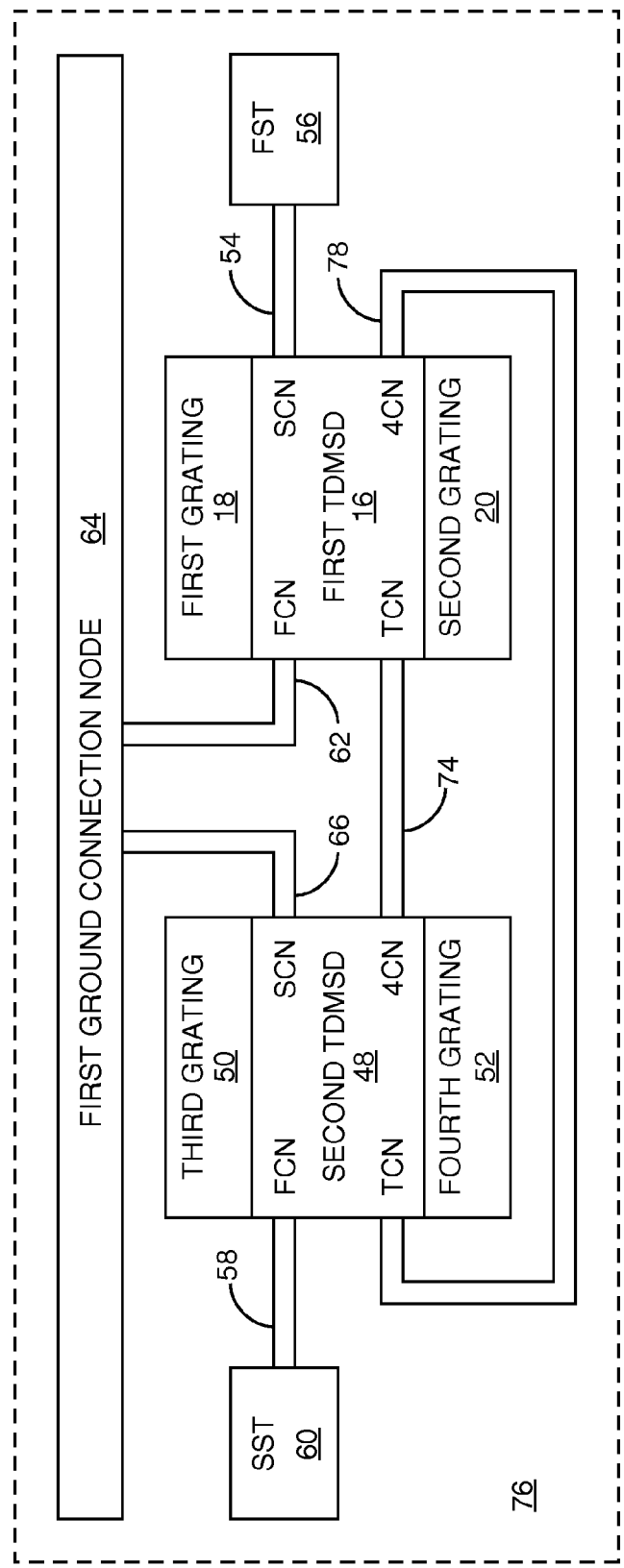
FIG. 5 shows a floating-connection cascaded DMSD device, according to one embodiment of the present invention.

FIG. 5 shows a floating-connection cascaded DMSD device 76, according to one embodiment of the present invention. The floating-connection cascaded DMSD device 76 may have improved parasitic characteristics compared to the cascaded DMSD device 46 illustrated in FIG. 4. Instead of coupling the TCN of the second TDMSD 48 and the 4CN of the first TDMSD 16 to ground as illustrated in FIG. 4, an eighth connection 78 is provided by the conductive layer 14 and couples the TCN of the second TDMSD 48 to the 4CN of the first TDMSD 16 to create a floating connection. By eliminating one-half of the ground connections, ground inductance may be reduced; however, throughput capacitance may be increased, which may reduce throughput isolation. Nevertheless, broadband rejection may be increased.

Figure 6:
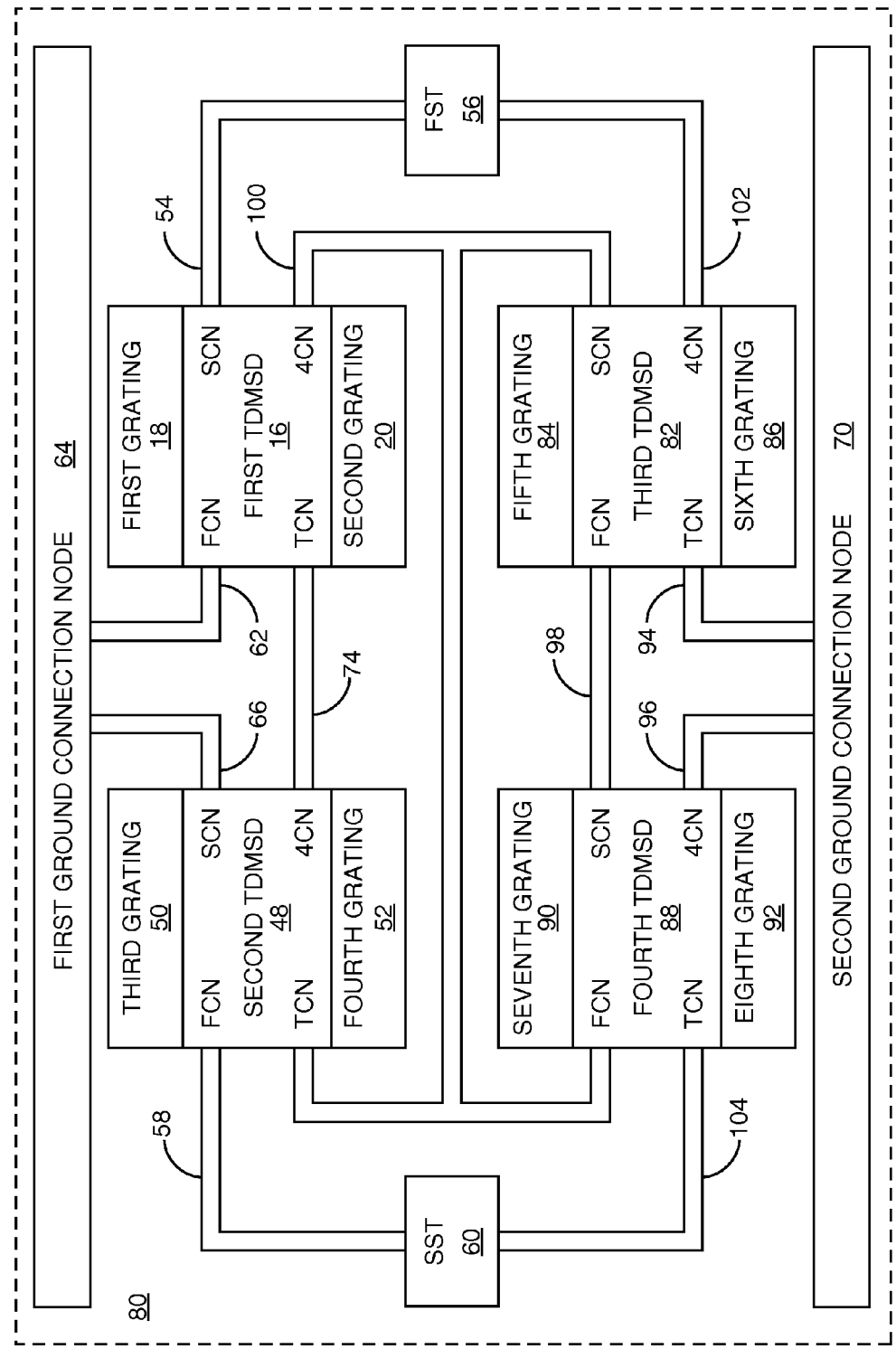
FIG. 6 shows a floating-connection four DMSD device, according to a first embodiment of the present invention.

FIG. 6 shows a floating-connection four DMSD device 80, according to a first embodiment of the present invention. The floating-connection four DMSD device 80 may have improved parasitic characteristics compared to the floating-connection cascaded DMSD device 76 illustrated in FIG. 5. The floating-connection four DMSD device 80 effectively couples two of the floating-connection cascaded DMSD devices 76 in parallel to create a four DMSD device with both parallel and cascaded DMSDs. The floating-connection four DMSD device 80 includes the first DMSD, the second DMSD, a third DMSD, and a fourth DMSD. The third DMSD is cascaded with the fourth DMSD. Each of the third and fourth DMSDs is similar to the first DMSD. The third DMSD includes a third TDMSD 82, a fifth grating structure 84, and a sixth grating structure 86. The third TDMSD 82 includes a fifth IDT (not shown) and a sixth IDT (not shown). The fifth IDT is adjacent to the fifth grating structure 84 and adjacent to the sixth IDT, which is adjacent to the sixth grating structure 86. The fifth and sixth grating structures 84, 86 may include multiple grating fingers that are about parallel to the interdigitated fingers of the fifth and sixth IDTs.

The fourth DMSD includes a fourth TDMSD 88, a seventh grating structure 90, and an eighth grating structure 92. The fourth TDMSD 88 includes a seventh IDT (not shown) and an eighth IDT (not shown). The seventh IDT is adjacent to the seventh grating structure 90 and adjacent to the eighth IDT, which is adjacent to the eighth grating structure 92. The seventh and eighth grating structures 90, 92 may include multiple grating fingers that are about parallel to the interdigitated fingers of the seventh and eighth IDTs. A ninth connection 94 is provided by the conductive layer 14 and couples the TCN of the third TDMSD 82 to the second GCN 70. A tenth connection 96 is provided by the conductive layer 14 and couples the 4CN of the fourth TDMSD 88 to the second GCN 70. An eleventh connection 98 is provided by the conductive layer 14 and couples the SCN of the fourth TDMSD 88 to the FCN of the third TDMSD 82.

A twelfth connection 100 is provided by the conductive layer 14 and couples the TCN of the second TDMSD 48, the 4CN of the first TDMSD 16, the FCN of the fourth TDMSD 88, and the SCN of the third TDMSD 82 to create a floating connection. In an alternate embodiment of the present invention, any or all of the TCN of the second TDMSD 48, the 4CN of the first TDMSD 16, the FCN of the fourth TDMSD 88, and the SCN of the third TDMSD 82 may be coupled to one another using any or all of the second grating structure 20, the fourth grating structure 52, the fifth grating structure 84, and the seventh grating structure 90.

A thirteenth connection 102 is provided by the conductive layer 14 and couples the 4CN of the third TDMSD 82 to the FST 56. A fourteenth connection 104 is provided by the conductive layer 14 and couples the TCN of the fourth TDMSD 88 to the SST 60. By coupling DMSDs in parallel, the acoustic width of each DMSD can be narrower, which reduces finger lengths 38, thereby reducing insertion loss.

By coupling to the second GCN 70, ground inductance may be reduced and parasitic characteristics may be improved. Any or all of the first, second, third, and fourth TDMSDs 16, 48, 82, 88 may have a corresponding chirping region between the first and second IDTs 22, 24, the third and fourth IDTs (not shown), the fifth and sixth IDTs (not shown), and the seventh and eighth IDTs (not shown), respectively.

The FST 56 may provide a first single-ended interface and the SST 60 may provide a second single-ended interface for the floating-connection four DMSD device 80. In one embodiment of the present invention, the first single-ended interface receives a single-ended input signal and the second single-ended interface provides a single-ended output signal.

FIGS. 7A, 7B, and 7C compare frequency responses of the cascaded DMSD device 46, the floating-connection cascaded DMSD device 76, and the floating-connection four DMSD device 80, respectively. The frequency responses may be associated with a SAW bandpass filter, which has a passband with a passband level $LVL_{PB}$ and should reject broadband signals at or below a maximum broadband level $LVL_{MAXBB}$. The passband has a passband frequency range $F_{PB}$. FIG. 7A illustrates a response of the cascaded DMSD device 46, which provides some broadband rejection; however, much of the frequency response exceeds the maximum broadband level $LVL_{MAXBB}$.

FIG. 7B illustrates a response of the floating-connection cascaded DMSD device 76, which has better broadband rejection than the cascaded DMSD device 46 illustrated in FIG. 7A; however, some of the frequency response exceeds the maximum broadband level $LVL_{MAXBB}$. The floating-connection cascaded DMSD device 76 may have a first resonant frequency $F_{RES1}$, which may improve the broadband rejection. FIG. 7C illustrates a response of the floating-connection four DMSD device 80, which has better broadband rejection than the floating-connection cascaded DMSD device 76 illustrated in FIG. 7B and does not exceed the maximum broadband level $LVL_{MAXBB}$. The floating-connection four DMSD device 80 may have a first resonant frequency $F_{RES1}$ and a second resonant frequency $F_{RES2}$, which may improve the broadband rejection.

FIG. 8 shows a four DMSD device 106, according to a second embodiment of the present invention. FIG. 6 illustrates a floating connection, whereas FIG. 8 illustrates the 4CN, the TCN, the SCN, and the FCN of the first, second, third, and fourth TDMSDs 16, 48, 82, and 88, respectively, coupled to a third GCN 108. A fifteenth connection 110 is provided by the conductive layer 14 and couples the 4CN of the first TDMSD 16 and the SCN of the third TDMSD 82 to the third GCN 108. A sixteenth connection 112 TCN is provided by the conductive layer 14 and couples the TCN of the second TDMSD 48 and the FCN of the fourth TDMSD 88 to the third GCN 108. In an alternate embodiment of the present invention, any or all of the TCN of the second TDMSD 48, the 4CN of the first TDMSD 16, the FCN of the fourth TDMSD 88, and the SCN of the third TDMSD 82 may be coupled to the third GCN 108 using any or all of the second grating structure 20, the fourth grating structure 52, the fifth grating structure 84, and the seventh grating structure 90.

FIG. 9 shows a balanced floating-connection four DMSD device 114, according to a third embodiment of the present invention. If a signal at the 4CN of the first TDMSD 16 is of equal amplitude and phase-shifted 180 degrees from a signal at the SCN of the third TDMSD 82, and the 4CN of the first TDMSD 16 is coupled to the SCN of the third TDMSD 82, then the resulting sum of the two signals may produce a signal about equal to ground. If a signal at the TCN of the second TDMSD 48 is of equal amplitude and phase-shifted 180 degrees from a signal at the FCN of the fourth TDMSD 88, and the TCN of the second TDMSD 48 is coupled to the FCN of the fourth TDMSD 88, then the resulting sum of the two signals may produce a signal about equal to ground. Under such conditions, no connection would be needed between the coupled 4CN of the first TDMSD 16 to the SCN of the third TDMSD 82 and the coupled TCN of the second TDMSD 48 to the FCN of the fourth TDMSD 88 since both signals are about equal to ground. The third embodiment of the present invention produces such conditions, and the twelfth connection 100 illustrated in FIG. 6 is replaced with a seventeenth connection 116 that is provided by the conductive layer 14 and couples the 4CN of the first TDMSD 16 to the SCN of the third TDMSD 82. An eighteenth connection 118 is provided by the conductive layer 14 and couples the TCN of the second TDMSD 48 to the FCN of the fourth TDMSD 88.

FIG. 10 shows a shared-grating balanced floating-connection four DMSD device 120, according to a fourth embodiment of the present invention. The second and fifth grating structures 20, 84 illustrated in FIG. 9 are replaced with a ninth grating structure 122. The fourth and seventh grating structures 52, 90 illustrated in FIG. 9 are replaced with a tenth grating structure 124. Therefore, in FIG. 10, the first DMSD includes the first TDMSD 16, the first grating structure 18, and the ninth grating structure 122. The first TDMSD 16 includes the first IDT 22 adjacent to the first grating structure 18 and adjacent to the second IDT 24, which is adjacent to the ninth grating structure 122. The second DMSD includes the second TDMSD 48, the third grating structure 50, and the tenth grating structure 124. The first and ninth grating structures 18, 122 may include multiple grating fingers that are about parallel to the interdigitated fingers of the first and second IDTs 22, 24.

The second TDMSD 48 includes the third IDT (not shown) and the fourth IDT (not shown). The third IDT is adjacent to the third grating structure 50 and adjacent the fourth IDT, which is adjacent to the tenth grating structure 124. The third and tenth grating structures 50, 124 may include multiple grating fingers that are about parallel to the interdigitated fingers of the third and fourth IDTs. The third DMSD includes the third TDMSD 82, the ninth grating structure 122, and the sixth grating structure 86. The third TDMSD 82 includes the fifth IDT (not shown) and the sixth IDT (not shown). The fifth IDT is adjacent to the ninth grating structure 122 and adjacent to the sixth IDT, which is adjacent to the sixth grating structure 86. The sixth and ninth grating structures 86, 122 may include multiple grating fingers that are about parallel to the interdigitated fingers of the fifth and sixth IDTs. The fourth DMSD includes the fourth TDMSD 88, the tenth grating structure 124, and the eighth grating structure 92. The fourth TDMSD 88 includes the seventh IDT (not shown) and the eighth IDT (not shown). The seventh IDT is adjacent to the tenth grating structure 124 and adjacent to the eighth IDT, which is adjacent to the eighth grating structure 92. The eighth and tenth grating structures 92, 124 may include multiple grating fingers that are about parallel to the interdigitated fingers of the seventh and eighth IDTs. By sharing grating structures, the shared-grating balanced floating-connection four DMSD device 120 may reduce size, complexity, and cost, and improve parasitic characteristics. The FST 56 may provide a first single-ended interface and the SST 60 may provide a second single-ended interface for the shared-grating balanced floating-connection four DMSD device 120.

FIG. 11 shows a single-ended interface and balanced interface four DMSD device 126, according to a fifth embodiment of the present invention. The first connection 54 couples the SCN of the first TDMSD 16 to the FST 56. A nineteenth connection 128 is provided by the conductive layer 14 and couples the 4CN of the third TDMSD 82 to a third SAW terminal (TST) 130. The SST 60 may provide a first single-ended interface. The FST 56 and the TST 130 may provide a first balanced interface for the single-ended interface and balanced interface four DMSD device 126. In one embodiment of the present invention, the first single-ended interface receives a single-ended input signal and the first balanced interface provides a balanced output signal. In an alternate embodiment of the present invention, the first balanced interface receives a balanced input signal and the first single-ended interface provides a single-ended output signal.

FIG. 12 shows a dual balanced interface four DMSD device 132, according to a sixth embodiment of the present invention. The second connection 58 couples the FCN of the second TDMSD 48 to the SST 60. A twentieth connection 134 is provided by the conductive layer 14 and couples the TCN of the fourth TDMSD 88 to a fourth SAW terminal (FOST) 136. The FST 56 and the TST 130 may provide a first balanced interface and the SST 60 and the FOST 136 may provide a second balanced interface for the dual balanced interface four DMSD device 132. In one embodiment of the present invention, the first balanced interface receives a balanced input signal and the second balanced interface provides a balanced output signal.

The first, second, third, and fourth DMSDs may be formed by removing parts of the conductive layer 14 using a removal process, such as etching. Alternatively, the first, second, third, and fourth DMSDs may be formed by adding parts of the conductive layer 14 using an additive process, such as deposition. The piezoelectric substrate 12 may include Quartz, Lithium Tantalate, Lithium Niobate or the like. The conductive layer 14 may include a metallization layer, or the like. Alternative embodiments of the present invention may include one or more intervening layers between the piezoelectric substrate 12 and the conductive layer 14 that still allow the piezoelectric substrate 12 and the conductive layer 14 to function as an IDT. Any or all of the first, second, and third GCNs 64, 70, 108 may be coupled to a direct current (DC) reference instead of ground. Any or all of the first, second, third, fourth, fifth, sixth, seventh, eighth, ninth, and tenth grating structures 18, 20, 50, 52, 84, 86, 90, 92, 122, 124 may be coupled to ground, the DC reference, or both.

Those skilled in the art will recognize improvements and modifications to the preferred embodiments of the present invention. All such improvements and modifications are considered within the scope of the concepts disclosed herein and the claims that follow.

What is claimed is:

1. A surface acoustic wave (SAW) device comprising:
   a piezoelectric substrate; and
   a conductive layer over the piezoelectric substrate and forming:
     a first 2-interdigital transducer (2-IDT) dual-mode SAW device (DMSD), wherein the first 2-IDT DMSD comprises a $first_1$ inter-digital transducer (IDT) having a first SC node adapted to receive an input signal and a first FC node coupled to a direct current (DC) reference and a $first_2$ IDT having a first TC node and a first 4C node;
     a second 2-IDT DMSD electrically coupled to the first 2-IDT DMSD and, wherein the second 2-IDT DMSD comprises a $second_1$ IDT having a second SC node and a second FC node and a $second_2$ IDT having a second TC node coupled to the DC reference and a second 4C node adapted to receive the input signal;

a third 2-IDT DMSD electrically coupled to the first 2-IDT DMSD and, wherein the third 2-IDT DMSD comprises a third$_1$ IDT having a third SC node coupled to the DC reference and a third FC node adapted to provide a first output signal based on the input signal and a third$_2$ IDT having a third TC node and a third 4C node; and a fourth 2-IDT DMSD electrically coupled to the second 2-IDT DMSD and to the third 2-IDT DMSD, and, wherein the fourth 2-IDT DMSD comprises a fourth$_1$ IDT having a fourth SC node and a fourth FC node and a fourth$_2$ IDT having a fourth TC node adapted to provide a second output signal based on the input signal and a fourth 4C node coupled to the DC reference wherein the first 4C node and the second SC node are coupled and the third TC node and the fourth FC node are coupled, but the first 4C node is not coupled to the third TC node.

2. The SAW device of claim 1 wherein the piezoelectric substrate comprises one of Lithium Tantalate and Lithium Niobate.

3. The SAW device of claim 1 wherein the conductive layer is a metallization layer.

4. The SAW device of claim 1 wherein the input signal is a single-ended signal and the SAW device is adapted to provide a single-ended output signal based on the first output signal and the second output signal.

5. The SAW device of claim 1 wherein:
the SAW device is adapted to provide a balanced output signal having a first signal and a second signal, such that:
the first signal is based on the first output signal; and
the second signal is based on the second output signal; and
the input signal is a single-ended input signal.

6. The SAW device of claim 1 wherein:
the input signal is a balanced input signal having a first signal and a second signal, such that:
the first 2-IDT DMSD is further adapted to receive the first signal; and
the second 2-IDT DMSD is further adapted to receive the second signal; and
the SAW device is adapted to provide a single-ended output signal based on the first output signal and the second output signal.

7. The SAW device of claim 1 wherein:
the input signal is a balanced input signal having a first signal and a second signal, such that:
the first 2-IDT DMSD is further adapted to receive the first signal; and
the second 2-IDT DMSD is further adapted to receive the second signal; and
the SAW device is adapted to provide a balanced output signal having a third signal and a fourth signal, such that:
the third signal is based on the first output signal; and
the fourth signal is based on the second output signal.

8. The SAW device of claim 1 wherein the SAW device is a bandpass filter.

9. The SAW device of claim 1 wherein the DC reference is ground.

10. The SAW device of claim 1 wherein:
the first 2-IDT DMSD further comprises a first grating structure adjacent to the first$_1$ IDT and a second grating structure adjacent to the first$_2$ IDT;
the second 2-IDT DMSD further comprises a third grating structure adjacent to the second$_1$ IDT and a fourth grating structure adjacent to the second$_2$ IDT;
the third 2-IDT DMSD further comprises a fifth grating structure adjacent to the third$_1$ IDT and a sixth grating structure adjacent to the third$_2$ IDT; and
the fourth 2-IDT DMSD further comprises a seventh grating structure adjacent to the fourth$_1$ IDT and a eighth grating structure adjacent to the fourth$_2$ IDT.

11. The SAW device of claim 10 wherein at least one of the first grating structure, the second grating structure, the third grating structure, the fourth grating structure, the fifth grating structure, the sixth grating structure, the seventh grating structure, and the eighth grating structure is coupled to a direct current (DC) reference.

12. The SAW device of claim 11 wherein the DC reference is ground.

13. The SAW device of claim 10 wherein the first 4C node, the second SC node, the third TC node, and the fourth FC node are coupled to at least one of the first grating structure, the second grating structure, the third grating structure, the fourth grating structure, the fifth grating structure, the sixth grating structure, the seventh grating structure, and the eighth grating structure.

14. The SAW device of claim 1 wherein the first TC node is coupled to the third 4C node; and
the second FC node is coupled to the fourth SC node.

* * * * *